US012210253B2

(12) United States Patent
Du et al.

(10) Patent No.: US 12,210,253 B2
(45) Date of Patent: Jan. 28, 2025

(54) DISPLAY PANEL AND DISPLAYING DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lili Du, Beijing (CN); Benlian Wang, Beijing (CN); Yue Long, Beijing (CN); Yao Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 446 days.

(21) Appl. No.: 17/390,759

(22) Filed: Jul. 30, 2021

(65) Prior Publication Data

US 2022/0102457 A1    Mar. 31, 2022

(30) Foreign Application Priority Data

Sep. 30, 2020  (CN) .......................... 202022217134.2

(51) Int. Cl.
*G02F 1/1362*   (2006.01)
*G02F 1/1339*   (2006.01)
*H01L 27/12*    (2006.01)
*H10K 59/121*   (2023.01)
*H10K 59/131*   (2023.01)

(52) U.S. Cl.
CPC .... *G02F 1/136209* (2013.01); *G02F 1/13394* (2013.01); *H01L 27/1214* (2013.01); *H10K 59/1213* (2023.02); *H10K 59/131* (2023.02)

(58) Field of Classification Search
None
See application file for complete search history.

(56) References Cited

U.S. PATENT DOCUMENTS

2017/0162111 A1* 6/2017 Kang ................... H10K 59/121
2021/0202621 A1* 7/2021 Liang ................... H10K 59/124

* cited by examiner

*Primary Examiner* — Dung T Nguyen
(74) *Attorney, Agent, or Firm* — Intellectual Valley Law, P.C.

(57) ABSTRACT

A display panel, wherein the display panel includes a displaying region; the displaying region includes a main displaying region, an auxiliary displaying region and an under-screen displaying region; first pixel driving circuits, first light emitting devices and second pixel driving circuits are provided under the auxiliary displaying region, and second light emitting devices are provided under the under-screen displaying region; the first pixel driving circuits are for driving the first light emitting devices, and the second pixel driving circuits are for driving the second light emitting devices; and the auxiliary displaying region is provided at an edge of the main displaying region.

16 Claims, 17 Drawing Sheets

DISPLAY PANEL AND DISPLAYING DEVICE

CROSS REFERENCE TO RELEVANT APPLICATIONS

The present disclosure claims the priority of the Chinese patent application filed on Sep. 30, 2020 before the Chinese Patent Office with the application number of 202022217134.2 and the title of "DISPLAY PANEL AND DISPLAYING DEVICE", which is incorporated herein in its entirety by reference.

TECHNICAL FIELD

The present disclosure relates to the technical field of displaying, and particularly relates to a display panel and a displaying device.

BACKGROUND

With the increasingly more demands on the visual effect of display products by consumers, ultra-narrow boundary frames or even full-screen displaying have become a new trend of the development of display-panel products. Because the screen-to-body ratio of many high-end mobile phones are gradually and steadily increasing, full screen has become the very trend currently.

A related technical solution of full-screens is to provide an under-screen displaying region at the middle part of the display panel, and a displaying region encircling the under-screen displaying region, wherein transparent light emitting devices are provided under the under-screen displaying region, and pixel driving circuits corresponding to the light emitting devices are provided within the displaying region adjacent to the under-screen displaying region. Accordingly, when an under-screen camera is being used, the light emitting devices under the under-screen displaying region may be controlled to be shut down, at which point the under-screen displaying region presents a transparent region, and thus does not affect the function of photographing of the under-screen camera under the under-screen displaying region.

SUMMARY

The embodiments of the present disclosure provide a display panel and a displaying device.

The embodiments of the present disclosure employ the following technical solutions:

In a first aspect, an embodiment of the present disclosure provides a display panel, wherein the display panel comprises a displaying region;
the displaying region comprises a main displaying region, an auxiliary displaying region and an under-screen displaying region;
first pixel driving circuits, first light emitting devices and second pixel driving circuits are provided under the auxiliary displaying region, and second light emitting devices are provided under the under-screen displaying region;
the first pixel driving circuits are for driving the first light emitting devices, and the second pixel driving circuits are for driving the second light emitting devices; and
the auxiliary displaying region is provided at an edge of the main displaying region.

Optionally, the displaying region is polygonal, and the auxiliary displaying region is provided at any edge of the displaying region, and is semi-encircled by the main displaying region.

Optionally, the displaying region is polygonal, and the auxiliary displaying region is provided at any corner of the displaying region.

Optionally, the displaying region is elliptical, and the auxiliary displaying region is provided at an edge of the displaying region, and is semi-encircled by the main displaying region.

Optionally, the second pixel driving circuits and the second light emitting devices are connected by transparent traces.

Optionally, the transparent traces are made from a transparent material.

Optionally, the transparent material is a transparent electrically conductive metal oxide.

Optionally, the transparent electrically conductive metal oxide includes tin oxide, an indium-tin composite oxide, indium oxide, zinc oxide and a zinc-antimony composite oxide.

Optionally, the under-screen displaying region is closely adhered to the auxiliary displaying region; or
the under-screen displaying region and the auxiliary displaying region have a spacing therebetween.

Optionally, the auxiliary displaying region encircles the under-screen displaying region.

Optionally, the auxiliary displaying region is located on at least one of sides of the under-screen displaying region that are in a first direction.

Optionally, third pixel driving circuits and third light emitting devices are provided under the main displaying region, and the third pixel driving circuits are for driving the third light emitting devices.

Optionally, the display panel further comprises a displaying base plate and a packaging layer for packaging the displaying base plate; and
the displaying base plate comprises a substrate, light emitting devices provided in each of sub-pixel units on the substrate, and pixel driving circuits, wherein the pixel driving circuits include a plurality of instances of the first pixel driving circuits, a plurality of instances of the second pixel driving circuits, and a plurality of instances of the third pixel driving circuits.

Optionally, the displaying base plate further comprises a pixel defining layer; and
a planarization layer is provided between the pixel defining layer and the substrate, and a thin-film transistor is provided inside the planarization layer.

Optionally, all of regions of the packaging layer, of the substrate, of the planarization layer and of the pixel defining layer that correspond to a position of the under-screen displaying region are made of a transparent material.

In another aspect, an embodiment of the present disclosure further provides a displaying device, wherein the displaying device comprises the display panel according to the above technical solutions.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art can obtain other figures according to these figures without paying creative work.

DETAILED DESCRIPTION

Figure 1:
FIG. 1 is a schematic structural diagram of the display panel according to an embodiment of the present disclosure, when the auxiliary displaying region is provided at the upper edge of the displaying region.

The technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In the description of the present disclosure, it should be understood that the terms that indicate orientation or position relations, such as "middle", "upper", "lower", "left", "right", "horizontal", "top", "bottom", "inner" and "outer", are based on the orientation or position relations shown in the drawings, and are merely for conveniently describing the present disclosure and simplifying the description, rather than indicating or implying that the device or element must have the specific orientation and be constructed and operated according to the specific orientation. Therefore, they should not be construed as a limitation on the present disclosure.

The terms "first" and "second" are merely for the purpose of describing, and should not be construed as indicating or implying the degrees of importance or implicitly indicating the quantity of the specified technical features. Accordingly, the features defined by "first" or "second" may explicitly or implicitly comprise one or more of the features. In the description of the present disclosure, unless stated otherwise, the meaning of "plurality of" is "two or more".

In the description of the present disclosure, it should be noted that, unless explicitly defined or limited otherwise, the terms "mount", "connect" and "link" should be interpreted broadly. For example, it may be fixed connection, detachable connection, or integral connection; and it may be direct connection or indirect connection by an intermediate medium, and may be the internal communication between two elements. For a person skilled in the art, the particular meanings of the above terms in the present disclosure may be comprehended according to particular situations.

Figure 5:
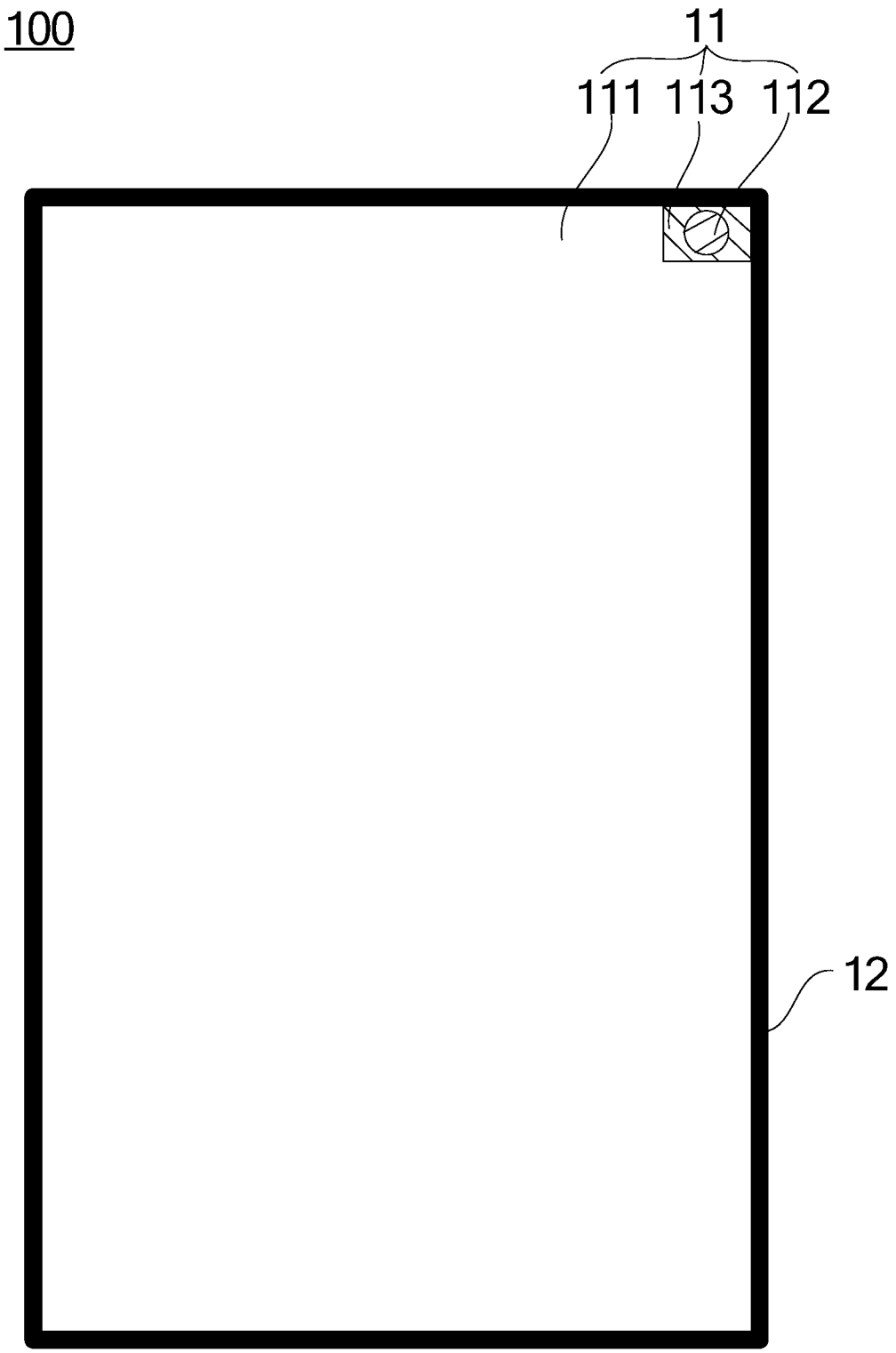
FIG. 5 is a schematic structural diagram of the display panel according to an embodiment of the present disclosure, when the auxiliary displaying region is provided at the top right corner of the displaying region.

In an aspect, an embodiment of the present disclosure provides a display panel 100, as shown in FIGS. 1 and 5, comprising a displaying region 11. The displaying region 11 is used for the displaying and imaging of the display panel, and comprises a main displaying region 111, an under-screen displaying region 112 and an auxiliary displaying region 113.

Taking a full-screen mobile phone having the display panel 100 as an example, the screen of the full-screen mobile phone corresponds to the displaying region 11, and is used for realizing the function of displaying and imaging of the mobile-phone screen, wherein the main displaying region 111 comprises the vast majority of the area of the mobile-phone screen. Because mobile phones are usually provided with a front-facing camera, and as for a full-screen mobile phone, the front-facing camera is required to be configured as an under-screen camera, part of the displaying region 11 is configured to be the under-screen displaying region 112, and the underneath position of the under-screen displaying region 112 is used for providing the under-screen camera. Moreover, the realizing of the function of photographing or shooting of the under-screen camera requires the under-screen displaying region 112 to have a good light transmittance. Accordingly, the unnecessary structural parts under the under-screen displaying region 112 are required to be provided under the region other than the under-screen displaying region 112, and the position of the displaying region 11 that corresponds to the region is the auxiliary displaying region 113. The whole of the region of the displaying region 11 other than the under-screen displaying region 112 and the auxiliary displaying region 113 is the main displaying region 111.

It should be noted that, in the displaying and imaging, the main displaying region 111, the under-screen displaying region 112 and the auxiliary displaying region 113 together form the complete mobile-phone screen (corresponding to the displaying region 11), to realize the complete function of the mobile phone of displaying and imaging. However, during the photographing by the mobile phone by using the under-screen camera, the under-screen displaying region 112 suspends the function of displaying and imaging to cooperate with the under-screen camera for the photographing.

Moreover, the application of the display panel to the mobile-phone device is merely an example, and the display panel may also be applied to any device, such as a television set, a display, a tablet personal computer and a smart watch. Furthermore, the display panel may be an Organic Light Emitting Diode (referred to for short as OLED) display panel or a Quantum-Dot Light Emitting Diode (referred to for short as QLED) display panel. The examples will not be listed in detail here.

Particularly, first pixel driving circuits and first light emitting devices are provided under the auxiliary displaying region 113. The first pixel driving circuits are for driving the first light emitting devices, thereby realizing the controlling on the displaying and imaging of the auxiliary displaying region 113. It should be noted that the one side of the auxiliary displaying region 113 that is used to display the image is the displaying face, by "under the auxiliary displaying region 113", that may mean being on the one side of the auxiliary displaying region 113 that is further away from its displaying face, and the first pixel driving circuits and the first light emitting devices are provided under the auxiliary displaying region 113, which can prevent that the first pixel driving circuits and the first light emitting devices block the displaying face of the auxiliary displaying region 113 and thus affect its effect of displaying and imaging. Second light emitting devices are provided under the under-screen displaying region 112, second pixel driving circuits for driving the second light emitting devices are provided under the auxiliary displaying region 113, and the second pixel driving circuits drive the second light emitting devices, thereby realizing the controlling on the displaying and imaging of the under-screen displaying region 112. Because no pixel driving circuit is provided under the under-screen displaying region 112, when the under-screen displaying region 112 is not displaying and imaging, it has a higher light transmittance than that of the auxiliary displaying region 113. Accordingly, the front-facing under-screen camera provided at the under-screen displaying region 112 can realize its function of photographing and shooting by using the under-screen displaying region 112, to in turn reach the effect of full-screen displaying of the display panel 100. The main displaying region 111 is the main region for displaying and imaging of the display panel 100, and comprises third light emitting devices provided under the main displaying region 111 and third pixel driving circuits for driving the third light emitting devices.

Because all of the first pixel driving circuits, the first light emitting devices and the second pixel driving circuits are provided under the auxiliary displaying region 113, the second pixel driving circuits, which is additionally provided, occupy part of the room for installation of the auxiliary displaying region 113, whereby the region under the auxiliary displaying region 113 does not have the sufficient space for providing sufficient first light emitting devices and first pixel driving circuits, which further results in that the density of the first light emitting devices provided under the auxiliary displaying region 113 is low, or, in other words, the screen pixel density of the auxiliary displaying region 113 is low. As a result, when the display panel 100 is displaying and imaging, the displayed frame of the auxiliary displaying region 113 has a poor quality, which affects the usage experience of the user.

Figure 2:
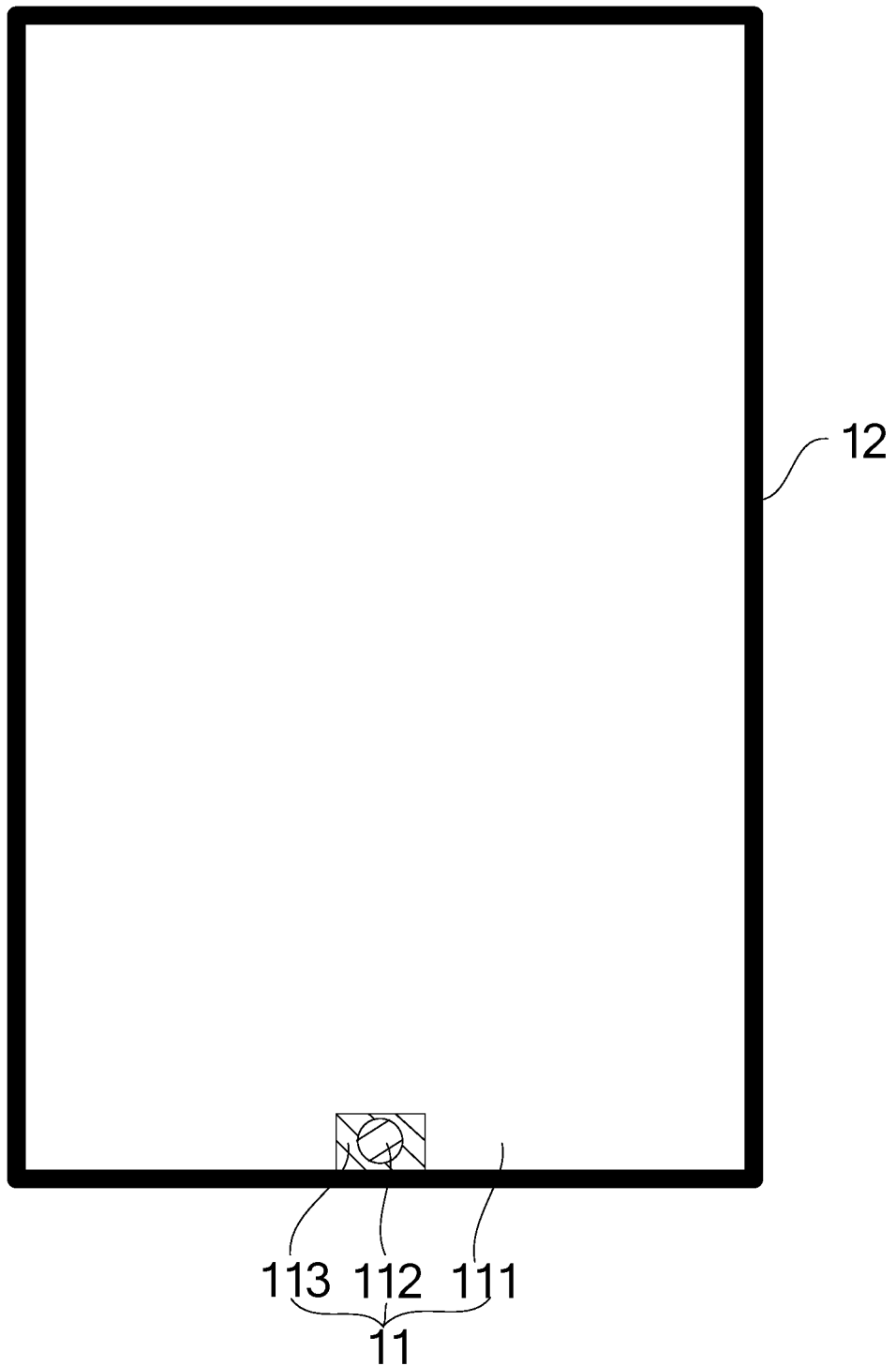
FIG. 2 is a schematic structural diagram of the display panel according to an embodiment of the present disclosure, when the auxiliary displaying region is provided at the lower edge of the displaying region.
Figure 6:
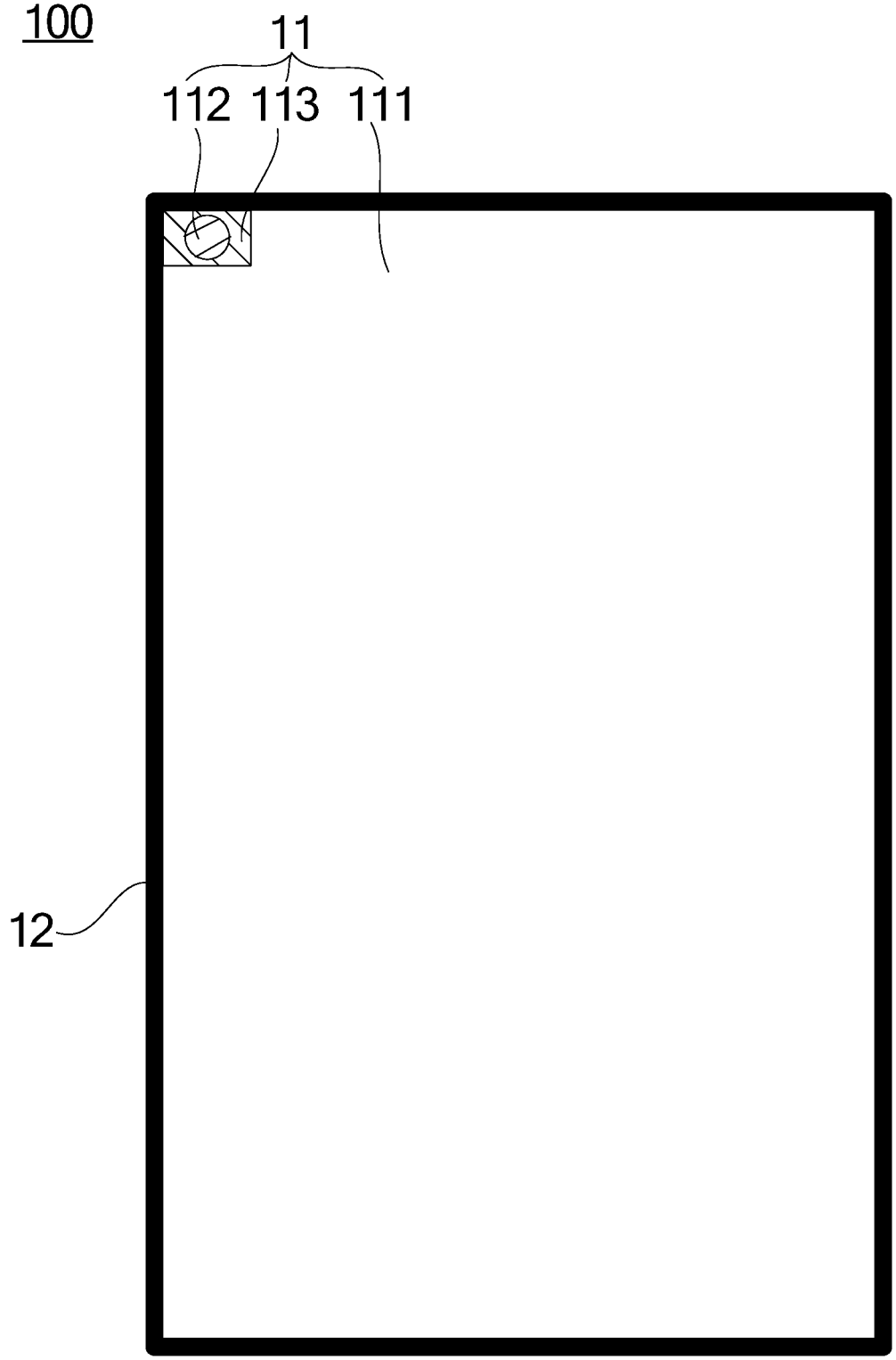
FIG. 6 is a schematic structural diagram of the display panel according to an embodiment of the present disclosure, when the auxiliary displaying region is provided at the top left corner of the displaying region.

In order to improve the usage experience of the user, the auxiliary displaying region 113 is provided at the edge of the main displaying region 111, as shown in FIGS. 2 and 6. Such a configuration enables the auxiliary displaying region 113 with the poor displayed frame to be closer to the edge of the main displaying region 111, which can weaken the affection on the entire displaying region 11 by the poor frame displaying quality of the auxiliary displaying region 113, to prevent affecting the usage experience of the user.

Particularly, the particular process of the display panel 100 realizing photographing and shooting by using the under-screen camera in the full screen is as follows. The under-screen camera is provided under the under-screen displaying region 112. When the under-screen camera is not operating, the under-screen displaying region 112, under the driving and controlling by the second pixel driving circuits, together with the main displaying region 111 and the auxiliary displaying region 113, realizes the displaying and imaging of the displaying region 11 of the display panel 100. Moreover, after a predetermined program has been started up to perform photographing or shooting by using the under-screen camera, the under-screen displaying region 112, under the driving and controlling by the second pixel driving circuits, shuts down the second light emitting devices, at which point, because the affection on the displaying and imaging of the under-screen displaying region 112 has been prevented, the position of the display panel 100 that corresponds to the under-screen displaying region 112 has a high light transmittance, and does not affect the function of light sensation of the under-screen camera in photographing or shooting. After the function of photographing or shooting of the under-screen camera has been completed, the predetermined program exits, at which point the under-screen displaying region 112, under the driving and controlling by the second pixel driving circuits, returns to the function of displaying and imaging, and, together with the main displaying region 111 and the auxiliary displaying region 113, realizes the displaying and imaging of the displaying region 11 of the display panel 100.

It should be noted that all of the first light emitting devices, the first pixel driving circuits, the second light emitting devices, the second pixel driving circuits, the third light emitting devices and the third pixel driving circuits are a plurality of instances, wherein each of the first light emitting devices and each of the first pixel driving circuits, each of the second light emitting devices and each of the second pixel driving circuits, or each of the third light emitting devices and each of the third pixel driving circuits form a sub-pixel unit 200 in the displaying region 11.

Figure 11:
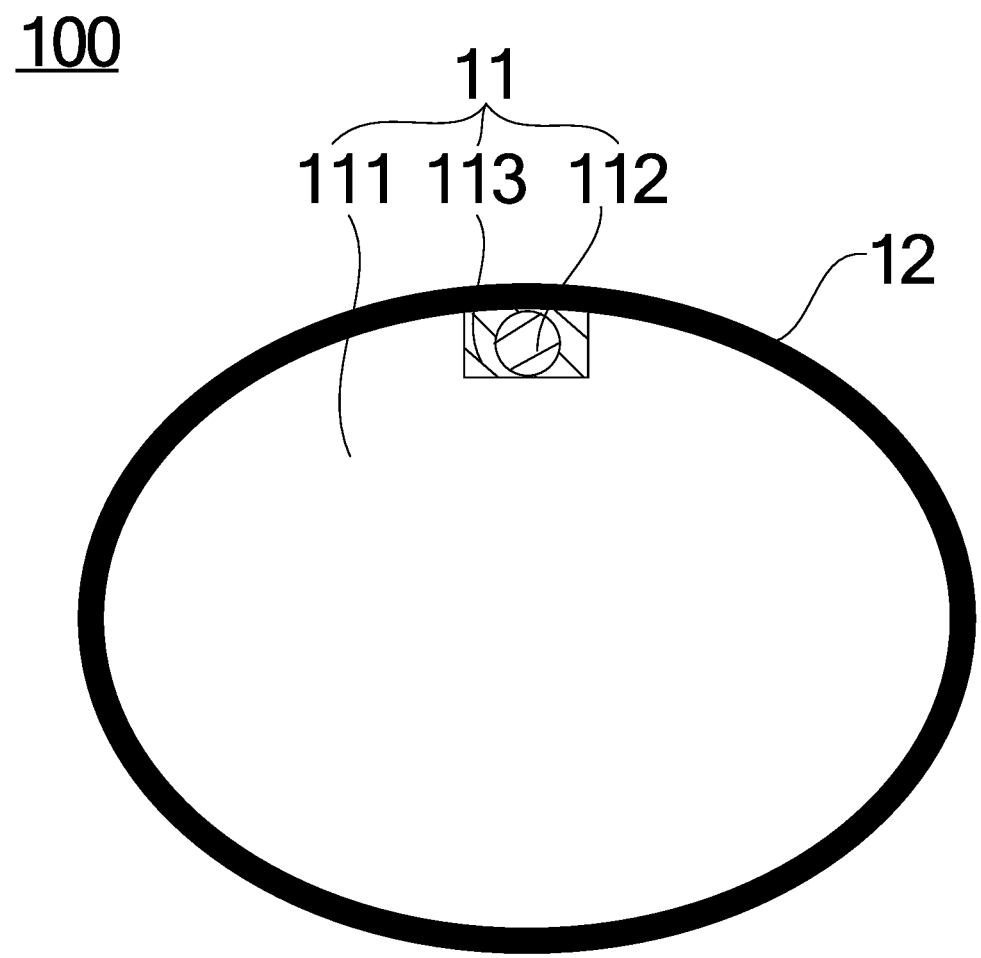
FIG. 11 is a schematic structural diagram of the display panel according to an embodiment of the present disclosure, when the displaying region is elliptical.
Figure 12:
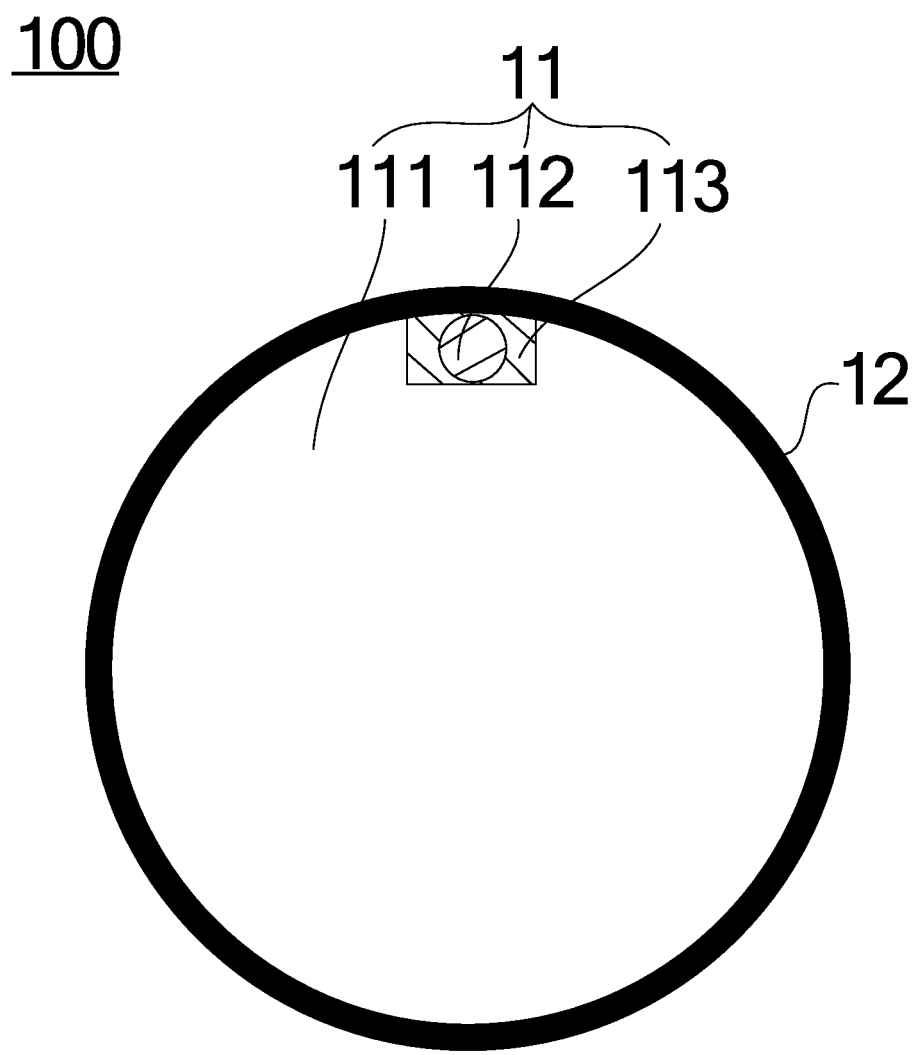
FIG. 12 is a schematic structural diagram of the display panel according to an embodiment of the present disclosure, when the displaying region is circular.
Figure 13:
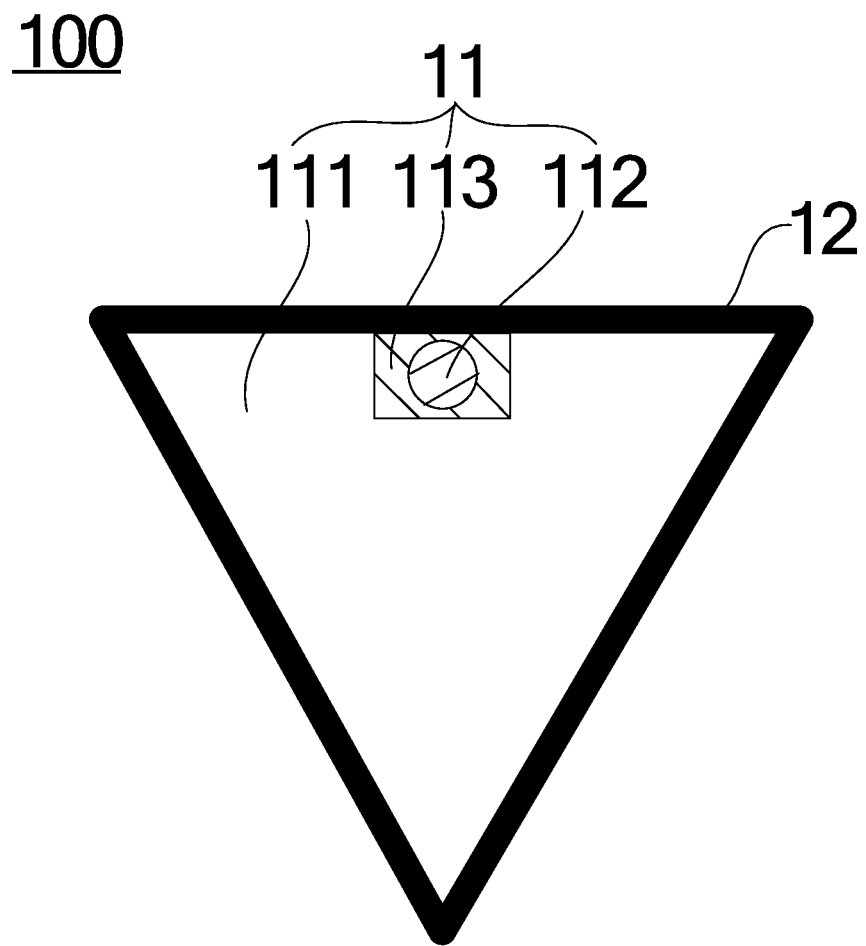
FIG. 13 is a first schematic structural diagram of the display panel according to an embodiment of the present disclosure, when the displaying region is triangular.

As shown in FIGS. 11 and 13, the displaying region 11 may be a polygon or ellipse located on the same one plane. The polygon includes any polygonal shape, such as a triangle, a rectangle, a pentagon or a concave polygon. Moreover, the ellipse includes an ellipse or a circle of any size, as shown in FIGS. 11 and 12. Moreover, the displaying region 11 may also be of a structural shape located on different planes, such as a foldable display panel. The examples are not particularly limited here, and depend on the usage scenes of the display panel 100.

Figure 3:
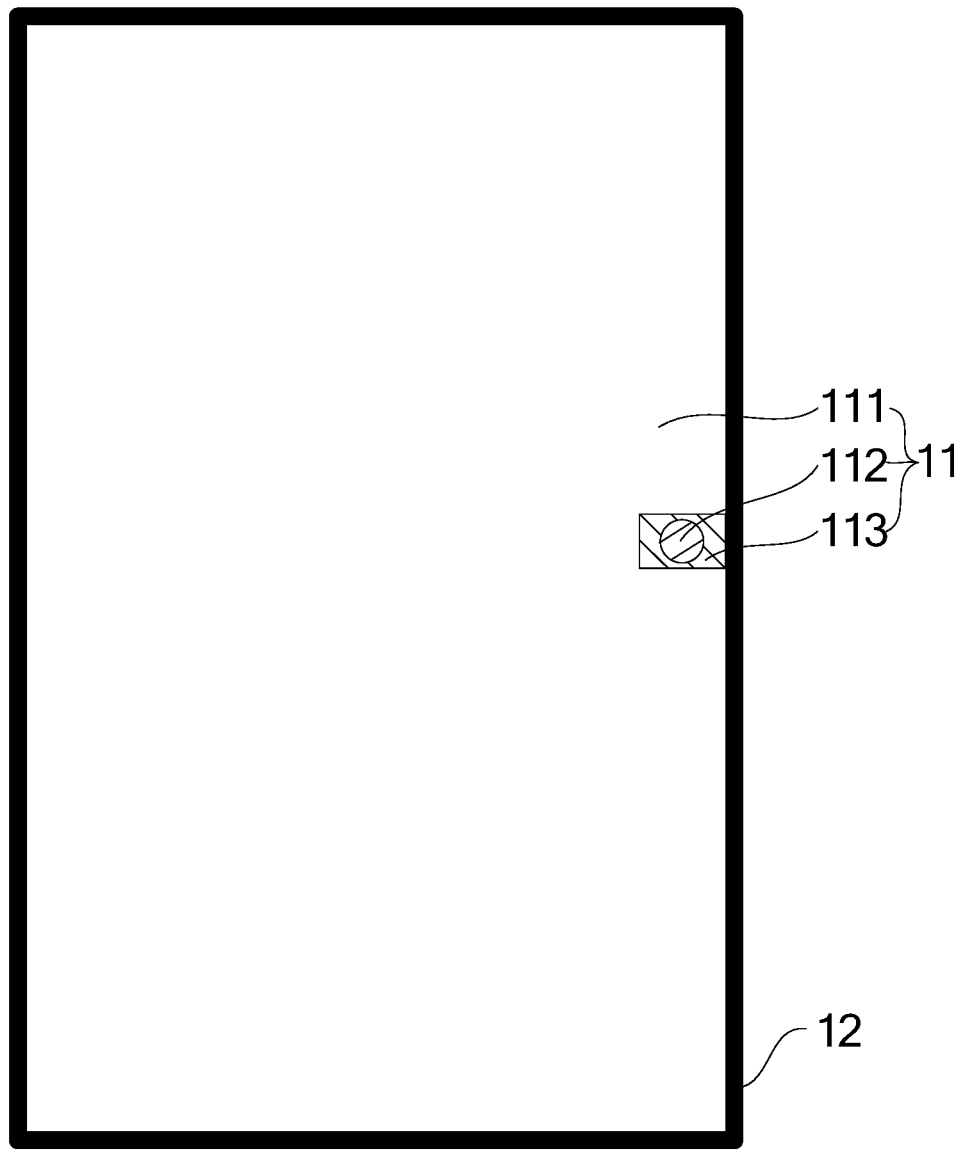
FIG. 3 is a schematic structural diagram of the display panel according to an embodiment of the present disclosure, when the auxiliary displaying region is provided at the right edge of the displaying region.
Figure 7:
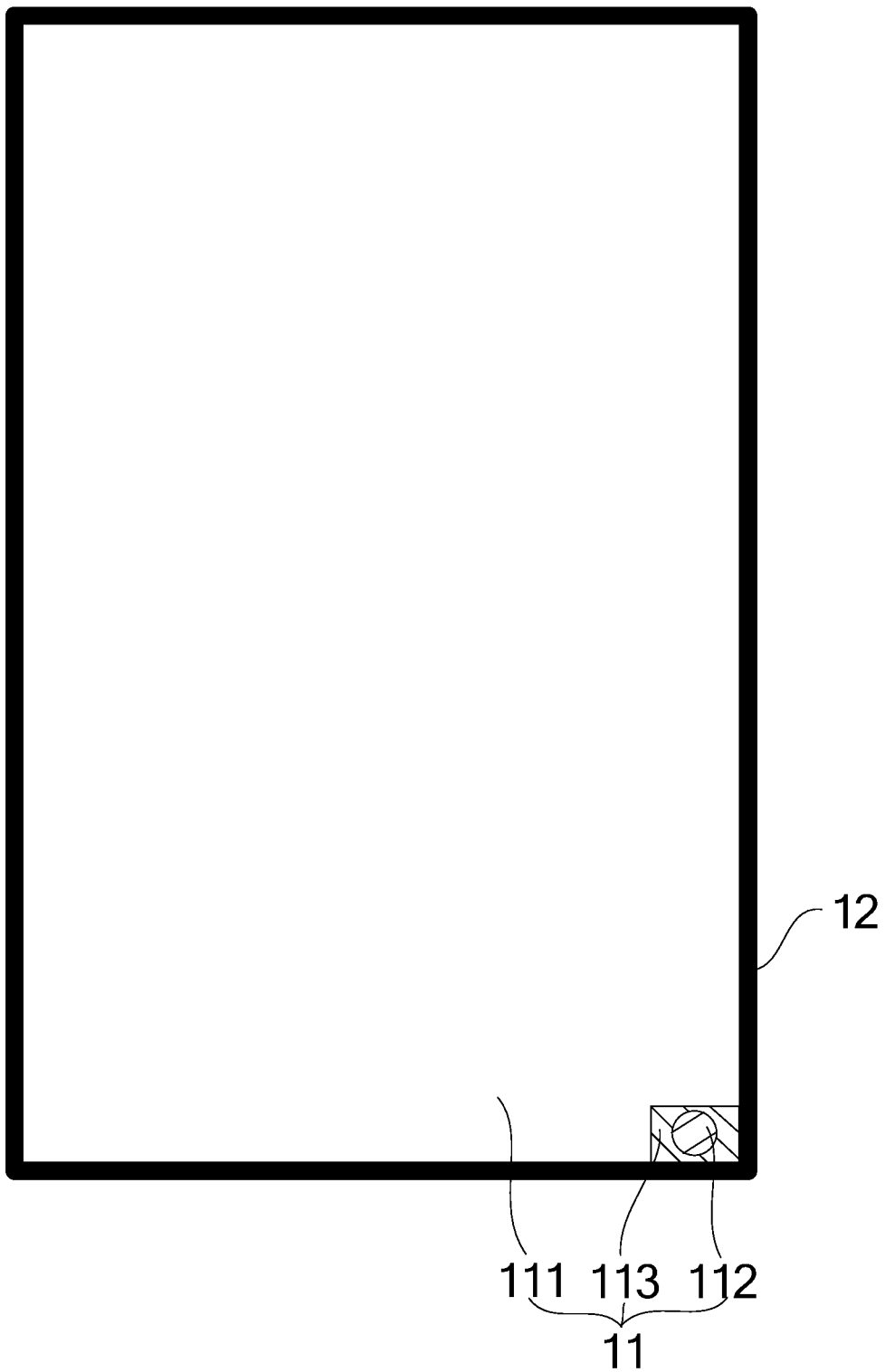
FIG. 7 is a schematic structural diagram of the display panel according to an embodiment of the present disclosure, when the auxiliary displaying region is provided at the bottom right corner of the displaying region.
Figure 8:
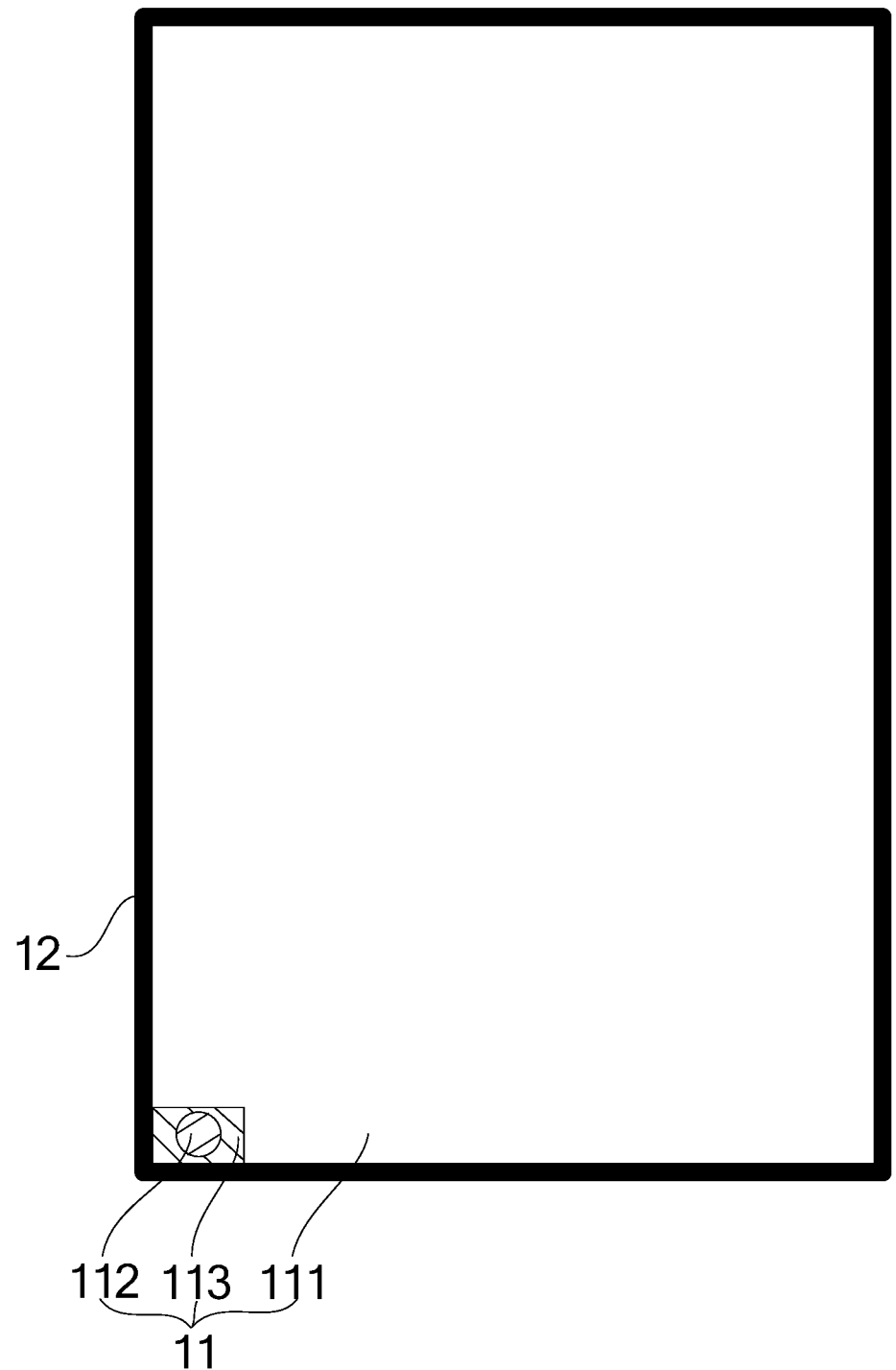
FIG. 8 is a schematic structural diagram of the display panel according to an embodiment of the present disclosure, when the auxiliary displaying region is provided at the bottom left corner of the displaying region.

For the different shapes of the displaying region 11, the particularly positions of the auxiliary displaying region 113 are different. Particularly, as shown in FIGS. 3 and 13, the displaying region 11 is polygonal, and the auxiliary displaying region 113 is provided at any edge of the displaying region 11, and is semi-encircled by the main displaying region 111. As shown in FIGS. 7 and 8, the displaying region 11 is also polygonal, and has a plurality of corners, and the auxiliary displaying region 113 is provided at any corner of the displaying region 11. Alternatively, as shown in FIG. 11, the displaying region 11 is elliptical, and the auxiliary displaying region 113 is provided at the edge of the displaying region 11, and is semi-encircled by the main displaying region 111. The particular position of the auxiliary displaying region 113 and the shape of the displaying region 11 are not particularly limited here. Because, in the above solutions, all of the auxiliary displaying regions 113 are provided at the edge of the displaying regions 11, i.e., located at the edge of the main displaying region 111, apparently, all of them can weaken the affection on the entire displaying region 11 by the poor frame displaying quality of the auxiliary displaying region 113, to prevent affecting the usage experience of the user.

The electric connection between the light emitting devices and the corresponding pixel driving circuits are realized by traces. The traces are usually made from an electrically conductive material such as a metal or a metal oxide. In order to prevent that the connecting traces between the second pixel driving circuits and the second light emitting devices of the under-screen displaying region 112 affect the effect of light transmission and imaging of the under-screen displaying region 112, the second pixel driving circuits and the second light emitting devices are configured to be connected by transparent traces. Particularly, the material for fabricating the transparent traces is a transparent electrically conductive material, which includes transparent metal oxides such as tin oxide, an indium-tin composite oxide, indium oxide, zinc oxide and a zinc-antimony composite oxide. Therefore, after the light rays have irradiated the under-screen displaying region 112, the light rays can better penetrate the region where the transparent traces are provided, which further increases the light transmittance of the under-screen displaying region 112 when it is not displaying and imaging, and improves the effect of light collection of the under-screen camera.

Figure 4:
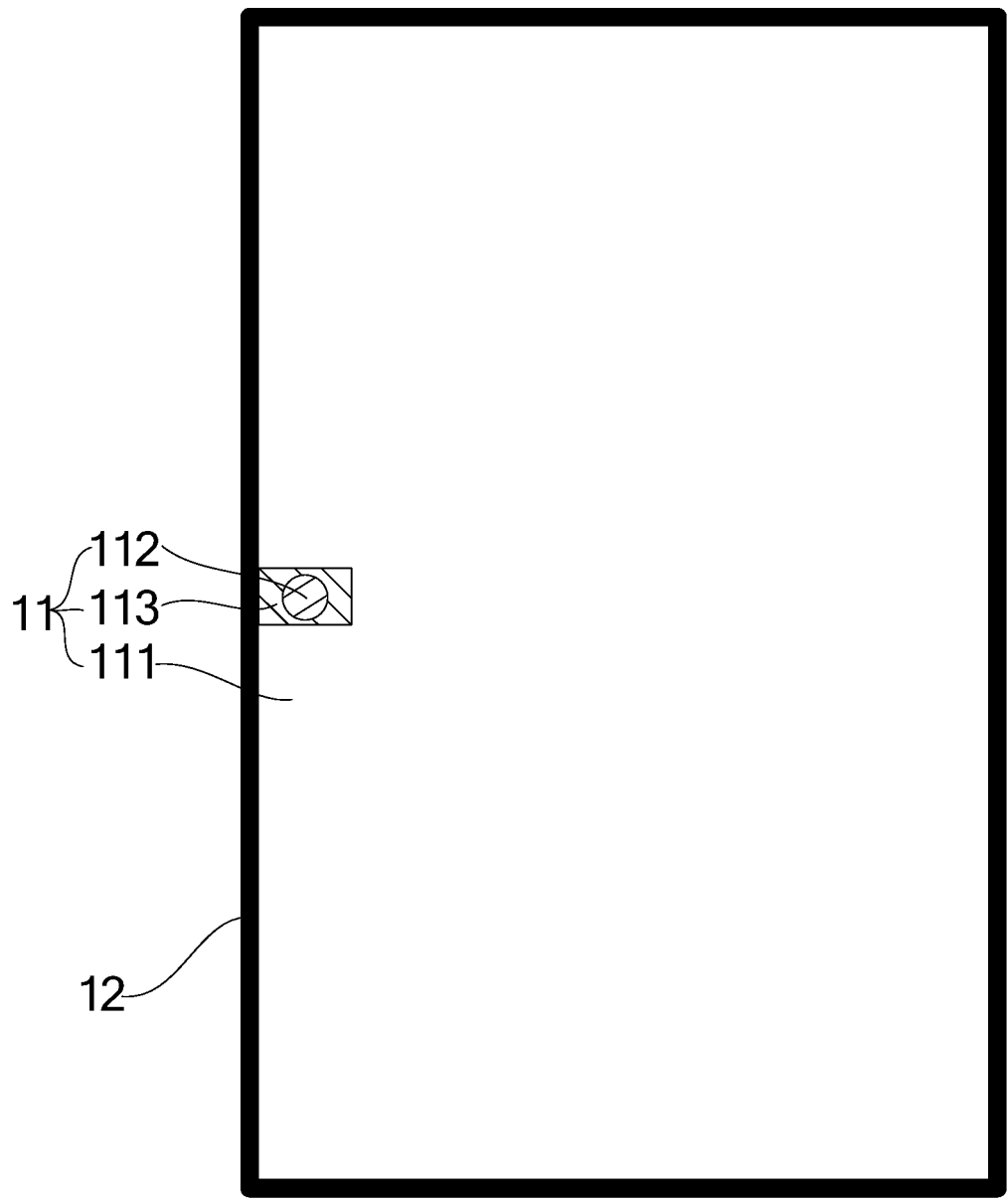
FIG. 4 is a schematic structural diagram of the display panel according to an embodiment of the present disclosure, when the auxiliary displaying region is provided at the left edge of the displaying region.
Figure 15:
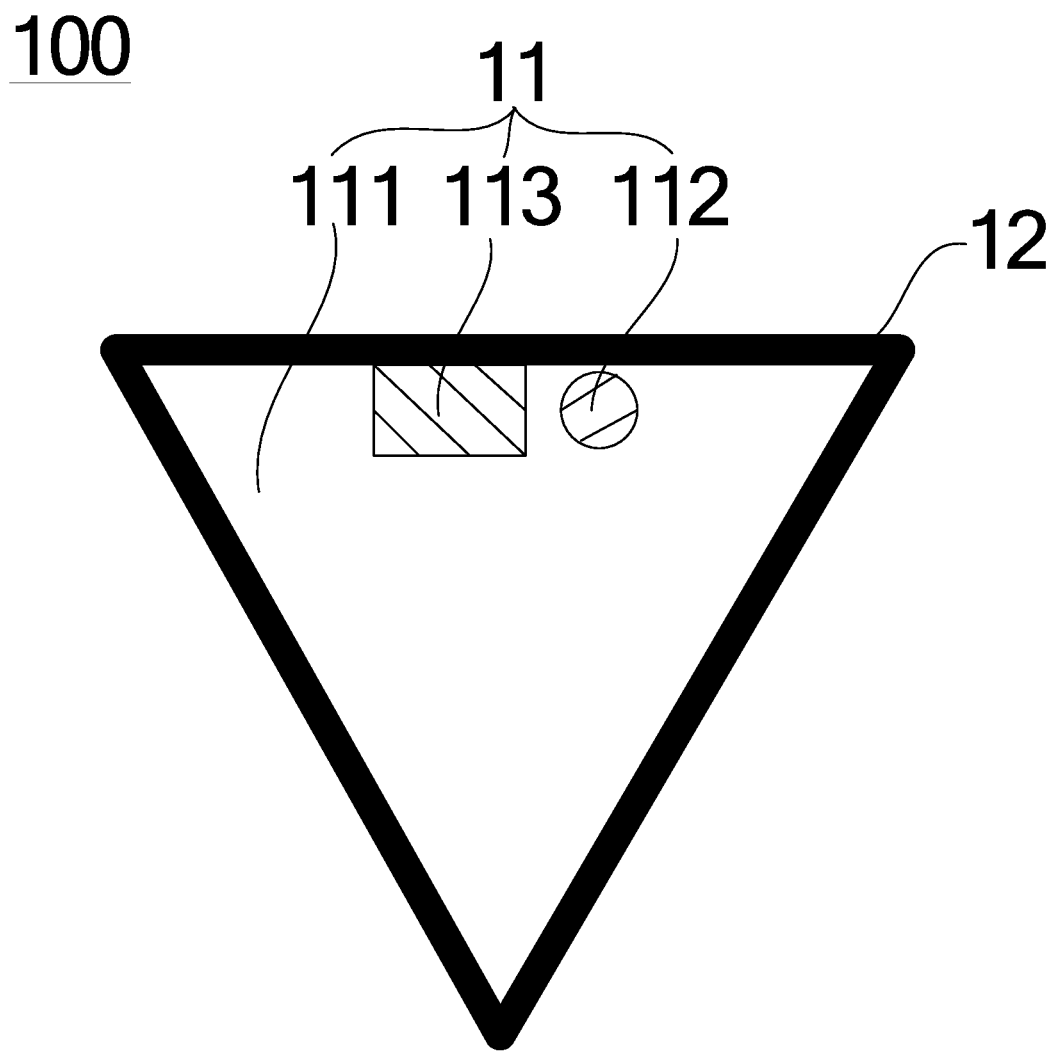
FIG. 15 is a third schematic structural diagram of the display panel according to an embodiment of the present disclosure, when the displaying region is triangular.

It should be noted that, firstly, regarding the feature that the auxiliary displaying region is semi-encircled by the main displaying region, as shown in FIGS. 4 and 15, when the auxiliary displaying region is located at the edge of the displaying region, the position of the contact between the auxiliary displaying region and the main displaying region forms a depressed structure, and the depressed structure of the main displaying region semi-encircles the auxiliary displaying region. Secondly, in the present application, the definition on transparency merely requires to have a relatively high light transmittance; for example, the light transmittance may be greater than 90%, 93%, 95% and so on, which is mainly used to realize the light collection and photographing of the under-screen camera.

Regarding the particular position relation between the auxiliary displaying region 113 and the under-screen displaying region 112, as shown in FIGS. 4 and 15, the auxiliary displaying region 113 is semi-encircled by the main displaying region 111, i.e., provided at the edge of the main displaying region 111. Moreover, the under-screen displaying region 112 may be provided at the edge of the main displaying region 111, and may also be provided at the middle part of the main displaying region 111, which does not affect the function of the under-screen camera provided under the under-screen displaying region 112, and is not particularly limited here.

Referring to FIG. 15, the under-screen displaying region 112 and the auxiliary displaying region 113 have a spacing therebetween; in other words, the under-screen displaying region 112 and the auxiliary displaying region 113 have a gap therebetween. By using such a configuration, the position relation between the under-screen displaying region 112 and the auxiliary displaying region 113 is more flexible, which enables the display panel 100 to have more extensive application scenes. For example, as for a mobile phone, if the position of the under-screen camera is too adjacent to the position of the boundary frame 12 of the displaying region 11, that is adverse to the design in the layout of the mainboard of the mobile phone. Accordingly, the auxiliary displaying region 113 is provided at the edges or the corners of the displaying region 11, and the under-screen displaying region 112 may be arranged flexibly according to the particular position of the under-screen camera.

Figure 16:
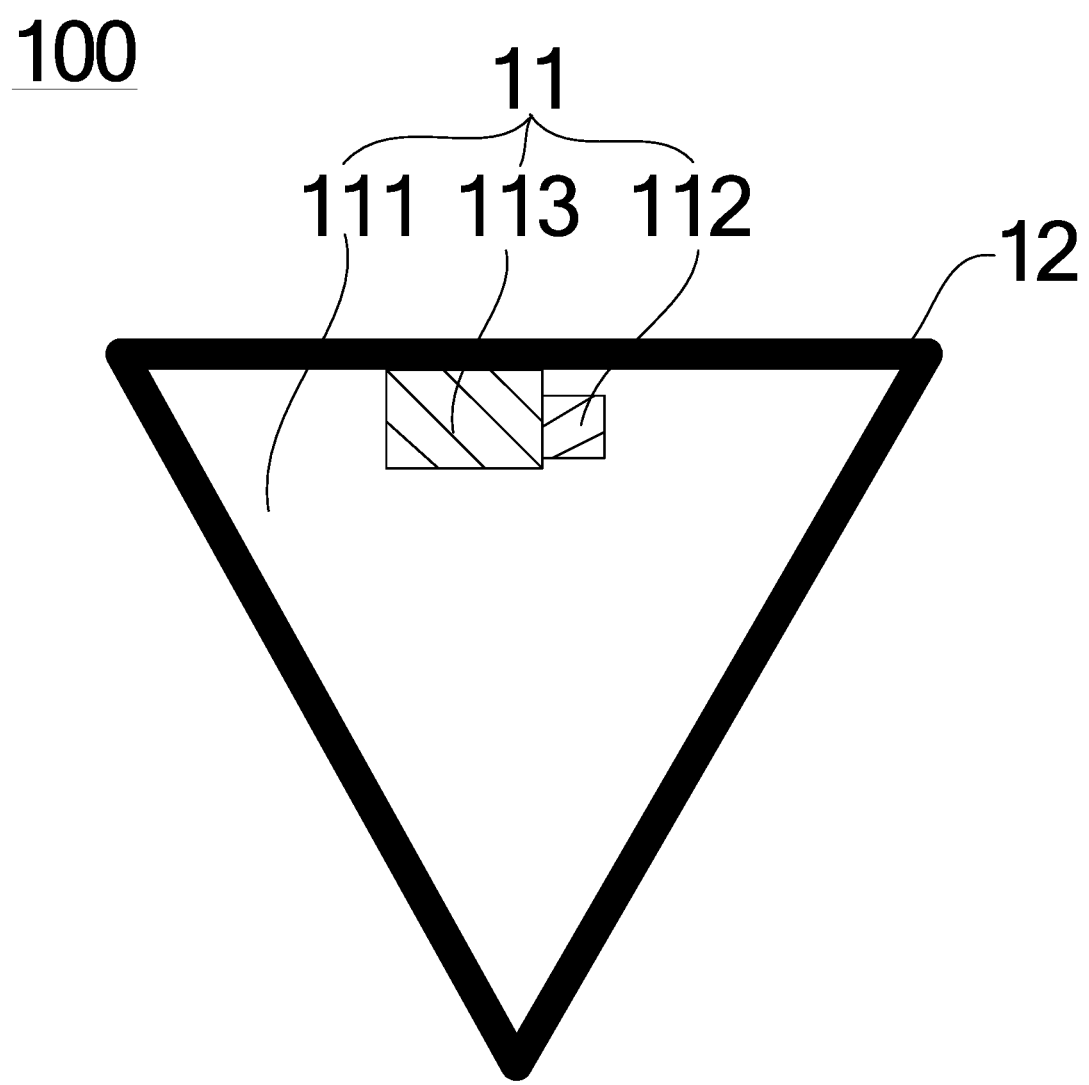
FIG. 16 is a fourth schematic structural diagram of the display panel according to an embodiment of the present disclosure, when the displaying region is triangular.

Moreover, as shown in FIG. 16, the under-screen displaying region 112 is closely adhered to the auxiliary displaying region 113; in other words, some or all of the edges of the under-screen displaying region 112 contact the auxiliary displaying region. That can shorten the distances between the second pixel driving circuits and the second light emitting devices, and can shorten the lengths of the connecting traces, which facilitates the arrangement of the traces between the second pixel driving circuits and the second light emitting devices, and simplifies the design solution for the distribution of the electric circuits on the base plate of the display panel 100.

Figure 14:
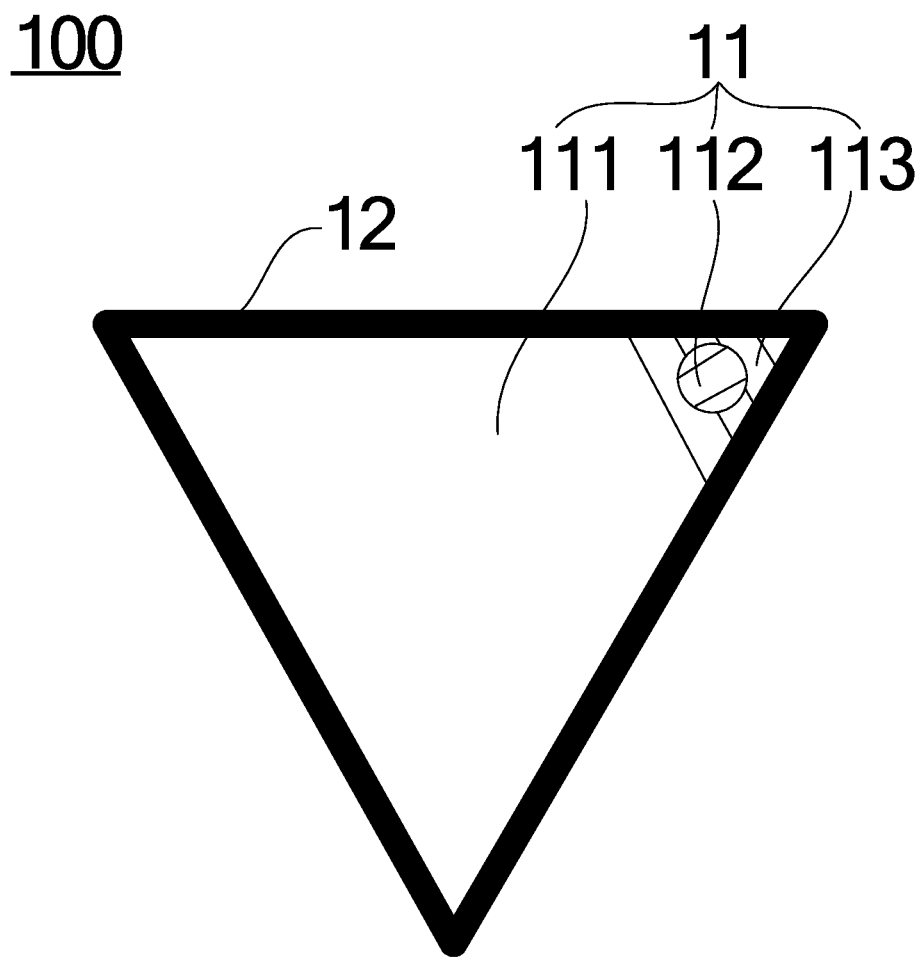
FIG. 14 is a second schematic structural diagram of the display panel according to an embodiment of the present disclosure, when the displaying region is triangular.

Optionally, as shown in FIG. 14, the auxiliary displaying region 113 is configured to encircle the under-screen displaying region 112. Accordingly, the second pixel driving circuits can be evenly distributed in the circumferential direction of the under-screen displaying region 112 at the positions adjacent to the underneath position of the auxiliary displaying region 113, which, as compared with the solution that the second pixel driving circuits are provided concentratedly in the same one direction, can simplify the design in the layout of the second pixel driving circuits and the traces.

Figure 17:
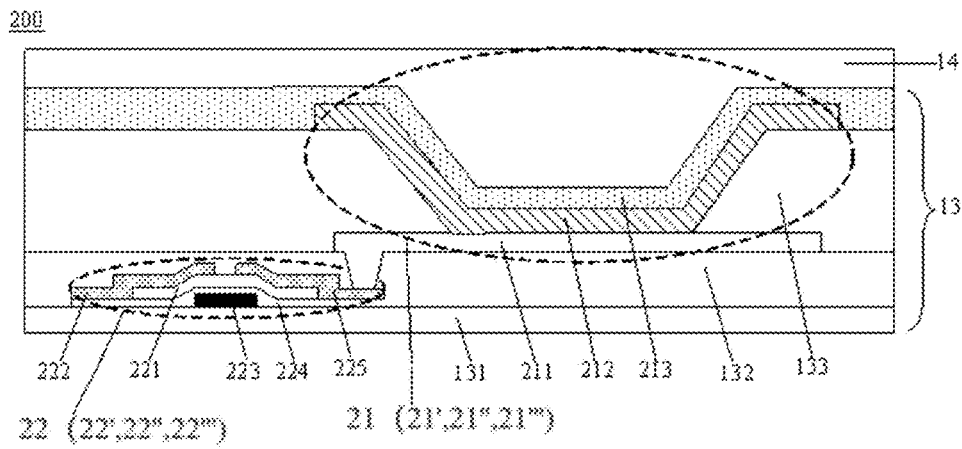
FIG. 17 is a schematic structural diagram of a sub-pixel unit of the display panel according to an embodiment of the present disclosure.
Figure 18:
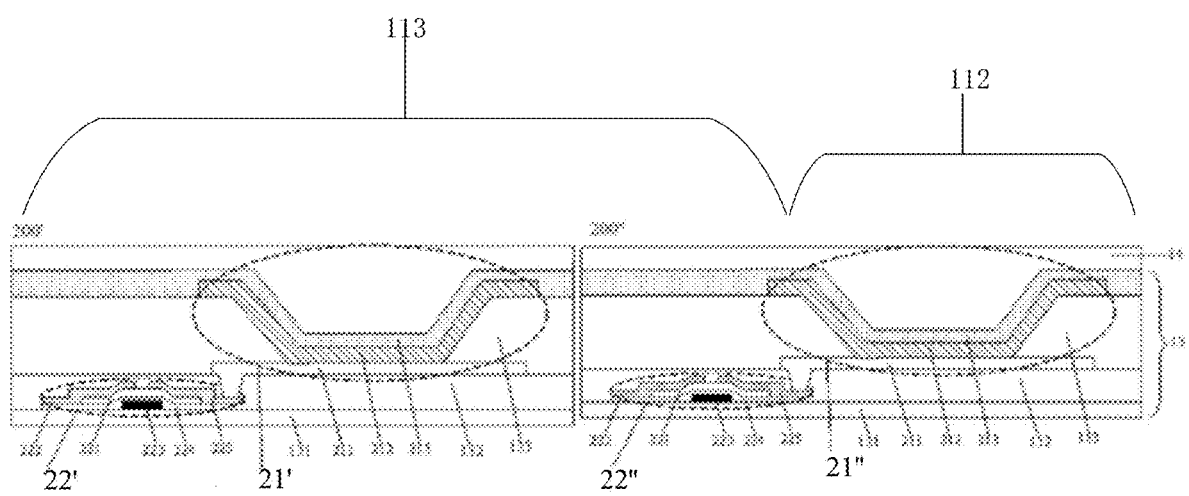
FIG. 18 is a schematic structural diagram of sub-pixel units of the display panel according to an embodiment of the present disclosure.

As shown in FIG. 17, the display panel 100 comprises a displaying base plate 13 and a packaging layer 14 for packaging the displaying base plate 13. The packaging layer 14 may be a packaging thin film, and may also be a packaging base plate. Referring continuously to FIG. 17, the displaying base plate 13 comprises a substrate 131, light emitting devices 21 provided in each of the sub-pixel units 200 on the substrate 131, and the pixel driving circuits, the pixel driving circuits include the plurality of first pixel driving circuits 22', the plurality of second pixel driving circuits 22" and the plurality of third pixel driving circuits 22''', the particular structure of each of the light emitting devices 21 comprises an anode 211, a light emitting functional layer 212 and a cathode 213, and the anode 211 is electrically connected to the drain 225 of a thin-film transistor 22 (i.e., the traces connecting the pixel driving circuits and the light emitting devices 21). The displaying base plate 13 further comprises a pixel defining layer 133, the pixel defining layer 133 comprises a plurality of opening regions, and each of the light emitting devices 21 is provided within one of the opening regions, to form one sub-pixel point.

Particularly, a planarization layer 132 is between the pixel defining layer 133 and the substrate 131. The thin-film transistor 22 is provided inside the planarization layer 132, and comprises a grid 223 provided on the substrate 131. A grid insulating layer 224 is provided on the grid 223. An active layer 221 covers the grid insulating layer 224. A source 222 and the drain 225 are provided on the active layer 221 with a spacing therebetween. The drain 225 is connected to a light emitting device 21 by a trace, the grid 223 is connected to a grid driving circuit, the source 222 is connected to a source driving circuit.

In the full-screen display panel 100 according to the present application, the light emitting devices and the pixel driving circuits for controlling the light emitting devices (i.e., the thin-film transistors 22) are provided under the displaying region 11. The pixel driving circuits include the first pixel driving circuits 22', the second pixel driving circuits 22" and the third pixel driving circuits 22''', and the light emitting devices 21 include the first light emitting devices 21', the second light emitting devices 21" and the third light emitting devices 21'''. Apparently, regarding the under-screen displaying region 112, all of the packaging layer 14 and the substrate 131, the planarization layer 132 and the pixel defining layer 133 in the displaying base plate 13 that correspond to that region are made from a transparent material, thereby preventing affecting the function of photographing of the under-screen camera. No second pixel driving circuit is provided within the displaying base plate 13 that corresponds to the under-screen displaying region 112; in other words, the second pixel driving circuits may be made from a non-transparent material.

In order to realize the controlling on the displaying of the plurality of sub-pixel units 200 on the display panel 100, generally a plurality of lines of grid driving circuits provided in a first direction are connected to the pixel driving circuits that correspond to each line of the sub-pixel units 200. In order to realize a better experience of the full screen of the display panel 100, the grid driving circuits are generally arranged in the mode of Gate Driver on Array (referred to for short as GOA).

Figure 9:
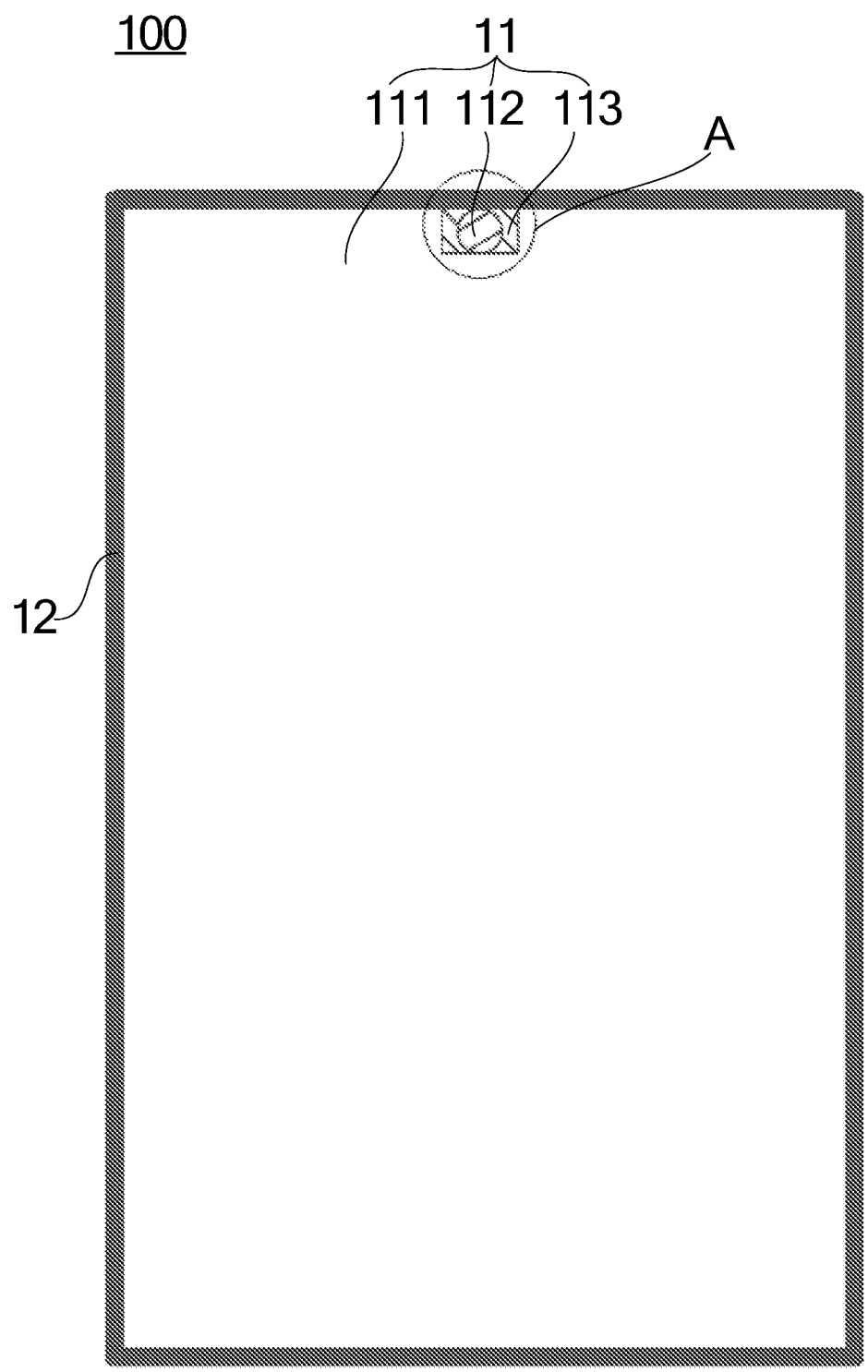
FIG. 9 is a schematic structural diagram of the display panel according to an embodiment of the present disclosure, when the auxiliary displaying region is in an ideal situation.

Accordingly, as shown in FIG. 9, the first direction refers to the direction of extension of the upper and lower boundary frames 12 of the rectangular displaying region 11, and the auxiliary displaying region 113 is configured to be located on at least one side of the under-screen displaying region 112. Taking FIG. 9 as an example for the declaration, when the auxiliary displaying region 113 is located on the left side of the under-screen displaying region 112, on the right side of the under-screen displaying region 112 or on both of the left side and the right side of the under-screen displaying region 112, the second pixel driving circuits that correspond to the sub-pixel units 200 under the under-screen displaying region 112 may be provided at the positions of the corresponding same lines under the auxiliary displaying region 113. Accordingly, the grid driving circuits can be directly connected, at the positions of the same lines, to the corresponding first pixel driving circuits, second pixel driving circuits and third pixel driving circuits. As compared with the technical solution that the auxiliary displaying region 113 is provided in the direction of extension of the left and right boundary frames of the rectangular displaying region 11 in FIG. 9 of the under-screen displaying region 112, that avoids the design solution in which the grid driving circuits and the second pixel driving circuits are required to be wire-wrapping connected, and simplifies the design in the layout of the grid driving circuits. Such an effect also applies to the design in the layout of GOA driving circuits.

The particular shapes of the auxiliary displaying region 113 and the under-screen displaying region 112, as shown in FIGS. 4 and 16, may be a regular shape such as a rectangle and a circle, and may also be an irregular shape, which is not particularly limited here.

Figure 10:
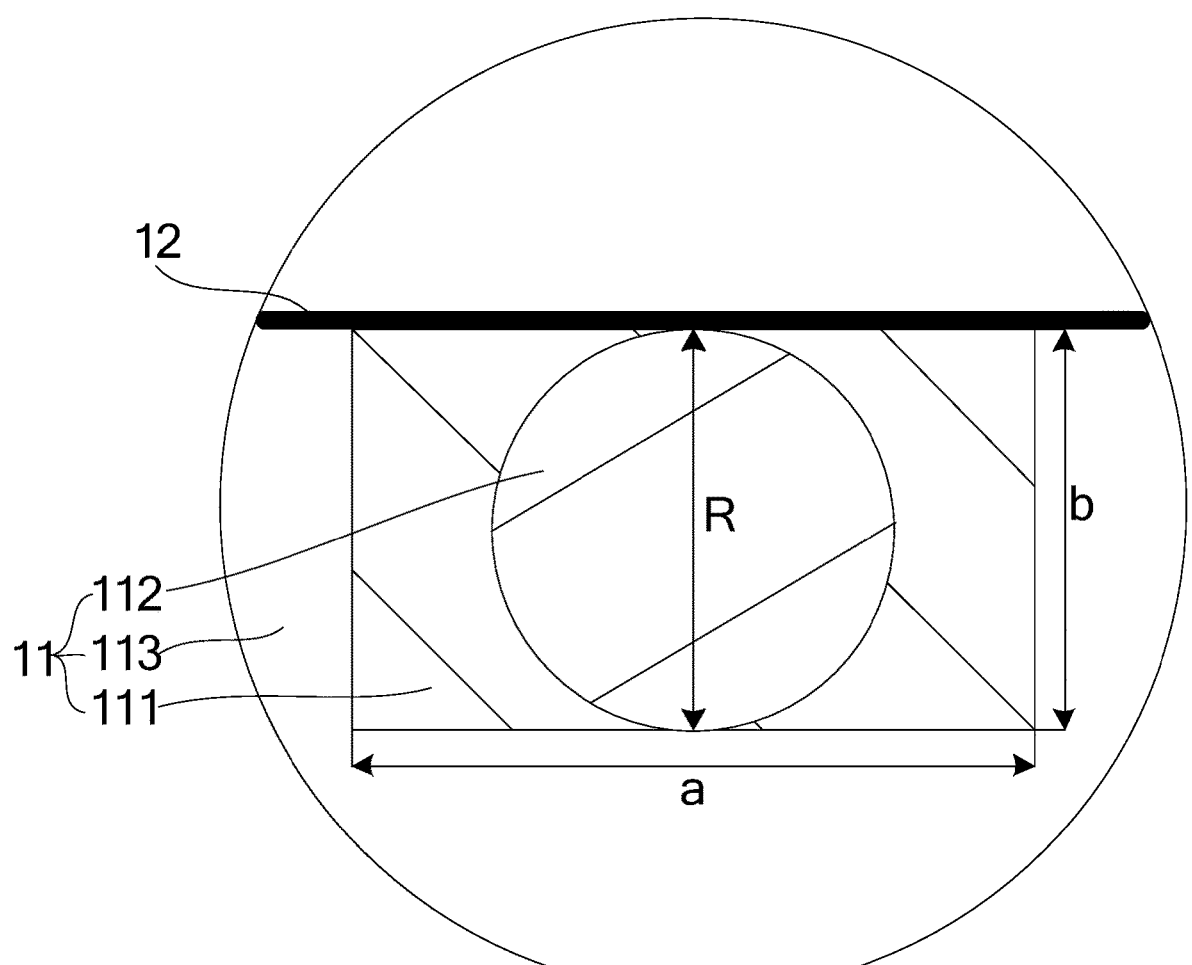
FIG. 10 is a schematic partially enlarged view of the position A shown in FIG. 9.

Particularly, as shown in FIG. 10, the auxiliary displaying region 113 is provided at the middle position of the upper edge of the main displaying region 111. The under-screen displaying region 112 of the diameter of R is closely adhered to the middle part of the auxiliary displaying region 113. The structural shapes of the under-screen displaying region 112 and the auxiliary displaying region 113 are a rectangle, wherein the length of the rectangle is a and the width is b. In an ideal situation, the width b and the diameter R are equal, and the shapes and the areas of the auxiliary displaying regions 113 on the two sides of the under-screen displaying region 112 are the same. In this case, the second pixel driving circuits are distributed under the auxiliary displaying region 113 in the direction of the same lines of the second light emitting devices. Accordingly, each line of the grid driving circuits can be connected directly to the second pixel driving circuit located at the position of this line, and, when passing through the under-screen displaying region 112, be individually connected to the corresponding grid driving circuits on the two sides of the under-screen displaying region 112 by wire wrapping. The second pixel driving circuits and the second light emitting devices are connected by transparent traces.

In another aspect, an embodiment of the present disclosure further provides a displaying device, wherein the displaying device comprises the display panel 100 according to any one of the above embodiments.

The displaying device may be any device, such as a mobile phone, a television set, a display, a tablet personal computer and a smart watch, and is not particularly limited herein.

As compared with the related art, the advantageous effects of the displaying device according to the present disclosure are the same as the advantageous effects of the display panel 100 according to the above technical solutions, and are not discussed here further. In the description of the present disclosure, the particular features, structures, materials or characteristics may be combined in any one or more embodiments or examples in a suitable form.

The above are merely particular embodiments of the present disclosure, and the protection scope of the present disclosure is not limited thereto. All of the variations or substitutions that a person skilled in the art can easily envisage within the technical scope disclosed by the present disclosure should fall within the protection scope of the present disclosure. Therefore, the protection scope of the present disclosure should be subject to the protection scope of the claims.

The invention claimed is:

1. A display panel, wherein the display panel comprises a displaying region;
   the displaying region comprises a main displaying region, an auxiliary displaying region and an under-screen displaying region;
   first pixel driving circuits, first light emitting devices and second pixel driving circuits are provided under the auxiliary displaying region, and second light emitting devices are provided under the under-screen displaying region;
   the first pixel driving circuits are for driving the first light emitting devices, and the second pixel driving circuits are for driving the second light emitting devices; and
   the auxiliary displaying region is provided at an edge of the main displaying region;
   wherein the display panel comprises a displaying base plate, the displaying base plate comprises a substrate, orthographic projections of the second light emitting devices on the substrate are not overlapped with the orthographic projections of the second pixel driving circuits on the substrate.

2. The display panel according to claim 1, wherein the displaying region is polygonal, and the auxiliary displaying region is provided at any edge of the displaying region, and is semi-encircled by the main displaying region.

3. The display panel according to claim 1, wherein the displaying region is polygonal, and the auxiliary displaying region is provided at any corner of the displaying region.

4. The display panel according to claim 1, wherein the displaying region is elliptical, and the auxiliary displaying region is provided at an edge of the displaying region, and is semi-encircled by the main displaying region.

5. The display panel according to claim 1, wherein the second pixel driving circuits and the second light emitting devices are connected by transparent traces.

6. The display panel according to claim 5, wherein the transparent traces are made from a transparent material.

7. The display panel according to claim 6, wherein the transparent material is a transparent electrically conductive metal oxide.

8. The display panel according to claim 7, wherein the transparent electrically conductive metal oxide includes tin oxide, an indium-tin composite oxide, indium oxide, zinc oxide and a zinc-antimony composite oxide.

9. The display panel according to claim 1, wherein the under-screen displaying region is closely adhered to the auxiliary displaying region; or
   the under-screen displaying region and the auxiliary displaying region have a spacing therebetween.

10. The display panel according to claim 1, wherein the auxiliary displaying region encircles the under-screen displaying region.

11. The display panel according to claim 1, wherein the auxiliary displaying region is located on at least one of sides of the under-screen displaying region that are in a first direction.

12. The display panel according to claim 1, wherein third pixel driving circuits and third light emitting devices are provided under the main displaying region, and the third pixel driving circuits are for driving the third light emitting devices.

13. The display panel according to claim 12, wherein the display panel further comprises a packaging layer for packaging the displaying base plate; and
    the displaying base plate further comprises light emitting devices provided in each of sub-pixel units on the substrate, and pixel driving circuits, wherein the pixel driving circuits include a plurality of first pixel driving circuits, a plurality of second pixel driving circuits, and a plurality of third pixel driving circuits.

14. The display panel according to claim 13, wherein the displaying base plate further comprises a pixel defining layer; and
    a planarization layer is provided between the pixel defining layer and the substrate, and a thin-film transistor is provided inside the planarization layer.

15. The display panel according to claim 14, wherein all of regions of the packaging layer, of the substrate, of the planarization layer and of the pixel defining layer that correspond to a position of the under-screen displaying region are made of a transparent material.

16. A displaying device, wherein the displaying device comprises the display panel according to claim 1.

* * * * *